United States Patent
Kobolla et al.

(10) Patent No.: US 11,837,525 B1
(45) Date of Patent: Dec. 5, 2023

(54) MODULE HAVING A MOULDED PLASTIC BODY AND A MULTIPLICITY OF LOAD TERMINAL ELEMENTS AND POWER SEMICONDUCTOR DEVICE THEREWITH

(71) Applicant: SEMIKRON ELEKTRONIK GMBH & CO. KG, Nuremberg (DE)

(72) Inventors: Harald Kobolla, Seukendorf (DE); Marco Lederer, Nuremberg (DE); Rainer Popp, Petersaurach (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 18/215,744

(22) Filed: Jun. 28, 2023

(30) Foreign Application Priority Data

Jul. 21, 2022 (DE) .................... 10 2022 118 268.1

(51) Int. Cl.
  *H01L 23/48* (2006.01)
  *H05K 7/20* (2006.01)
  *H01L 23/04* (2006.01)

(52) U.S. Cl.
  CPC .............. *H01L 23/48* (2013.01); *H01L 23/04* (2013.01); *H05K 7/20927* (2013.01)

(58) Field of Classification Search
  CPC ...... H01L 23/48; H01L 23/04; H05K 7/20927
  See application file for complete search history.

(56) References Cited

U.S. PATENT DOCUMENTS

| 5,424,579 A | 6/1995 | Arai et al. | |
| 2015/0364270 A1* | 12/2015 | Kawamura | H01H 9/02 174/520 |
| 2019/0103330 A1* | 4/2019 | Ishibashi | H01L 23/3121 |

FOREIGN PATENT DOCUMENTS

| DE | 102013219833 A1 | 2/2015 |
| DE | 102018112552 A1 | 11/2019 |
| EP | 3605762 A1 | 2/2020 |

OTHER PUBLICATIONS

DE 10 2022 118 268.1, Search Report dated Feb. 13, 2023, 5 pages—German, 5 pages—English.

* cited by examiner

*Primary Examiner* — Peniel M Gumedzoe
(74) *Attorney, Agent, or Firm* — Andrew F. Young; NOLTE LACKENBACH SIEGEL

(57) ABSTRACT

A module and a power semiconductor device wherein a module is configured with a molded plastic body and load terminal elements of the power semiconductor device, wherein respective load terminal elements are configured as a flat shaped metal body having a first main face and an opposite second main face, and having a first secondary face and an opposite second secondary face. The secondary faces connect the main faces, and have a terminal section, wherein the molded plastic body forms channels and comprises a bottom body part, a first and a second edge body and a partition body. The load terminal elements are arranged with a section in an associated channel, and an edge body of the channel has an indentation directed towards the one main face of the directly neighboring terminal element.

15 Claims, 4 Drawing Sheets

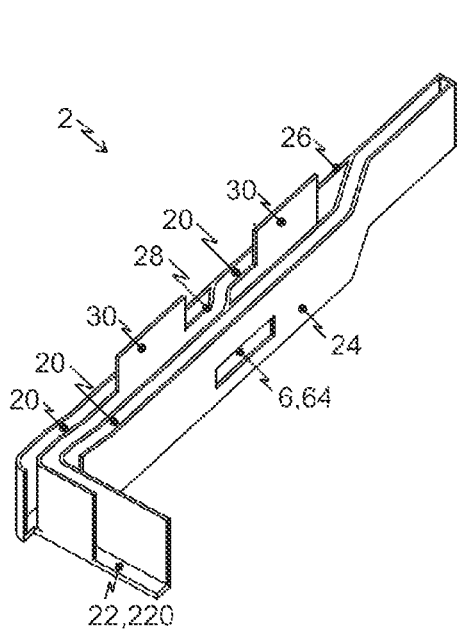
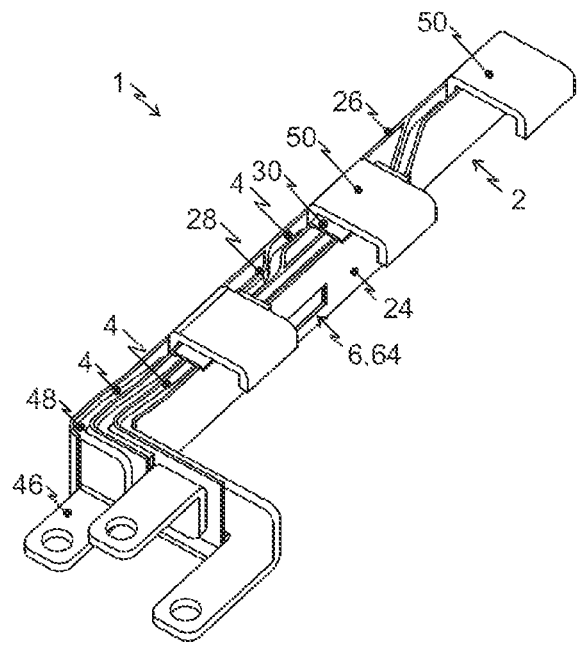
Fig. 4   Fig. 5
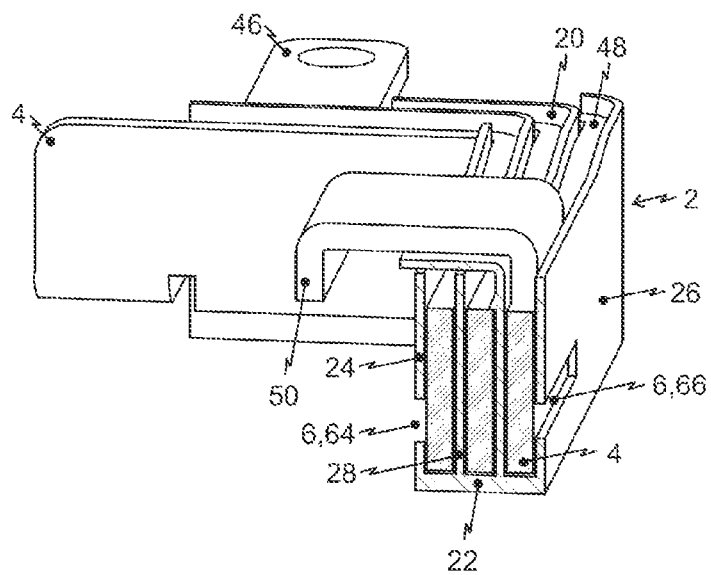
Fig. 6

MODULE HAVING A MOULDED PLASTIC BODY AND A MULTIPLICITY OF LOAD TERMINAL ELEMENTS AND POWER SEMICONDUCTOR DEVICE THEREWITH

CROSS REFERENCE TO RELATED APPLICATIONS

This application relates to and claims priority to DE 10 2022 118 268.1 filed Jul. 21, 2022, the entire contents of which are incorporated herein fully by reference.

FIGURE SELECTED FOR PUBLICATION

FIG. 1.

BACKGROUND OF THE INVENTION

Field of the Invention

The invention describes a module having a molded plastic body and a multiplicity of load terminal elements of a power semiconductor device, wherein the respective load terminal element is configured as a flat shaped metal body having a first main face and a second main face opposite the latter, and having a first secondary face and a second secondary face opposite the latter, wherein these secondary faces connect the main faces, and having a terminal section, wherein the molded plastic body forms a multiplicity of channels and to this end comprises a bottom body part, a first and a second edge body and a partition body, wherein a load terminal element is in each case arranged at least with a substantial section in an associated channel. The invention furthermore describes a power semiconductor device having such a module and having a power electronic switching device.

Description of the Related Art

DE 10 2018 112 552 A1 discloses a module and a power semiconductor device. The module is configured with a moulded plastic body and a multiplicity of load terminal elements of the power semiconductor device, wherein the respective load terminal element is configured as a flat shaped metal body having a first main face and a second main face opposite the latter, and having a first secondary face and a second secondary face opposite the latter, wherein these secondary faces connect the main faces, and having a terminal section, wherein the moulded plastic body forms a multiplicity of channels and to this end comprises a bottom body part, a first and a second edge body and a partition body, wherein a load terminal element is in each case arranged at least with a substantial section not materially bonded in an associated channel in such a way that the first and second main faces and the first secondary face are turned towards the inner side of the channel, and wherein the height of the partition body is in each case greater than the width of that neighbouring load terminal element which has the smaller width.

EP 3 605 762 A1 discloses an arrangement having a busbar device and a converter housing, wherein the busbar device comprises a stack of at least two busbars and an electrically insulating insulation body, which encloses the busbars in two insulation regions of the busbar device, wherein each busbar comprises two opposite base faces that extend in the current flow direction and side faces that extend in the current flow direction and connect the base faces, wherein the busbar device comprises a thermal control region, formed between the insulation regions, in which the insulation body has an opening that exposes one of the side faces and a part of at least one of the base faces of a respective busbar, wherein the busbars are thermally connected to the converter housing by a heat transfer means in the thermal control region.

ASPECTS AND OBJECTS OF THE INVENTION

In view of the aforementioned situation, the object of the invention is to propose a module for mutual electrical insulation of a multiplicity of load terminal elements of a power semiconductor device and such a power semiconductor device itself, wherein the dissipation of heat from the module is improved in comparison with the prior art.

This object is achieved according to the invention by a module having a moulded plastic body and a multiplicity of load terminal elements of a power semiconductor device, wherein the respective load terminal element is configured as a flat shaped metal body having a first main face and a second main face opposite the latter, and having a first secondary face and a second secondary face opposite the latter, wherein these secondary faces connect the main faces, and having a terminal section, wherein the moulded plastic body forms a multiplicity of channels and to this end comprises a bottom body part, a first and a second edge body and a partition body, wherein a load terminal element is in each case arranged at least with a substantial section in an associated channel, and wherein an edge body of the channel has an indentation directed towards the one main face of the directly neighbouring terminal element.

In this case, the load terminal elements may be provided and configured to carry DC potentials or AC potentials and be provided for power semiconductor devices, which are preferably configured as two-level, three-level or multi-level converters.

The indentation may in this case preferably be configured as an indentation that extends entirely through.

It may in principle be advantageous for the indentation to be arranged in a section of the channel that is arranged next to a subsection of that section of the directly neighbouring terminal element which experiences its greatest heating there during operation. It may in this case be advantageous for the main face of the load terminal element arranged directly next to the indentation that is turned towards the indentation to bear flush on the inner side of the associated channel. Alternatively, it may be advantageous for the main face of the load terminal element arranged directly next to the indentation that is turned towards the indentation to be arranged spaced apart from the inner side of the associated channel.

It may furthermore be advantageous for the indentation to be arranged in a section of the channel that is arranged next to a subsection of the section of the indirectly neighbouring terminal element which experiences its greatest heating there during operation. In particular, it is therefore possible to cool a terminal element that is not directly adjacent.

It may be preferred for a partition body to have an indentation that extends entirely through or does not extend entirely through, or both.

In an alternative, it may be preferred for the moulded plastic body to be formed from a material in the material group of elastomers, preferably silicone rubbers, in particular from thermally stabilized silicone rubber, particularly having a Shore A hardness of between 30 and 90, preferably between 55 and 70. In another alternative, it may also be preferred for the moulded plastic body to be formed from a material in the material group of polyolefins, in particular modified PTFEs, preferably filled PTFEs, in particular silicate-filled PTFE.

It is particularly advantageous for the height of the partition body to be in each case at least as great as the width of that neighbouring load terminal element which has the greater width.

It is particularly advantageous for one of the edge bodies or one of the partition bodies, or for both, to comprise a stop means, which is configured to limit a movement of the load terminal element arranged in an associated channel out of the channel, that is to say away from the bottom body. Of course, more than one edge body or more than one partition body may also comprise corresponding stop means.

In addition, one of the load terminal elements may have a corner, which is preferably arranged in a channel.

The aforementioned object is furthermore achieved according to the invention by a power semiconductor device having a module with a moulded plastic body and a multiplicity of load terminal elements according to one of the preceding claims, and having a power electronic switching device, wherein the module is arranged in a recess of a housing or of a cooling device of the power semiconductor device, and wherein the module is thermally conductively connected to a cooling surface by means of a thermally conductive substance, particularly in the region of the indentation.

It is preferred for the housing or the cooling device to comprise the cooling surface.

Preferably, the cooling device is configured as an air or liquid cooling device.

It may in particular be preferred for the thermally conductive substance to be configured as an electrically insulating casting compound, in particular comprising thermally conductive particles, in particular ceramic particles.

Of course, unless it is ruled out explicitly or per se, or conflicts with the concept of the invention, the features or groups of features respectively mentioned in the singular, for example the respective terminal sections and in particular the indentation, may also be present in the plural in the module according to the invention or the power semiconductor device.

It is to be understood that the various configurations of the invention, regardless of whether they are mentioned in the context of the module or the power semiconductor device, may be implemented individually or in any desired combinations in order to achieve improvements. In particular, the features mentioned and explained above and below may be used not only in the combinations specified but also in other combinations or separately, without departing from the scope of the present invention.

Further explanations of the invention, advantageous details and features may be found in the following description of the exemplary embodiments of the invention, which are schematically represented or respective parts thereof herein.

The above and other aspects, features, objects, and advantages of the present invention will become apparent from the following description read in conjunction with the accompanying drawings for exemplary but nonlimiting embodiments, in which like reference numerals designate the same elements.

BRIEF DESCRIPTION OF THE DRAWINGS

FIG. 4 shows a moulded plastic body of a third module according to the invention.

FIGS. 5 and 6 show this third module according to the invention.

DETAILED DESCRIPTION OF THE PREFERRED EMBODIMENTS

Figure 1:
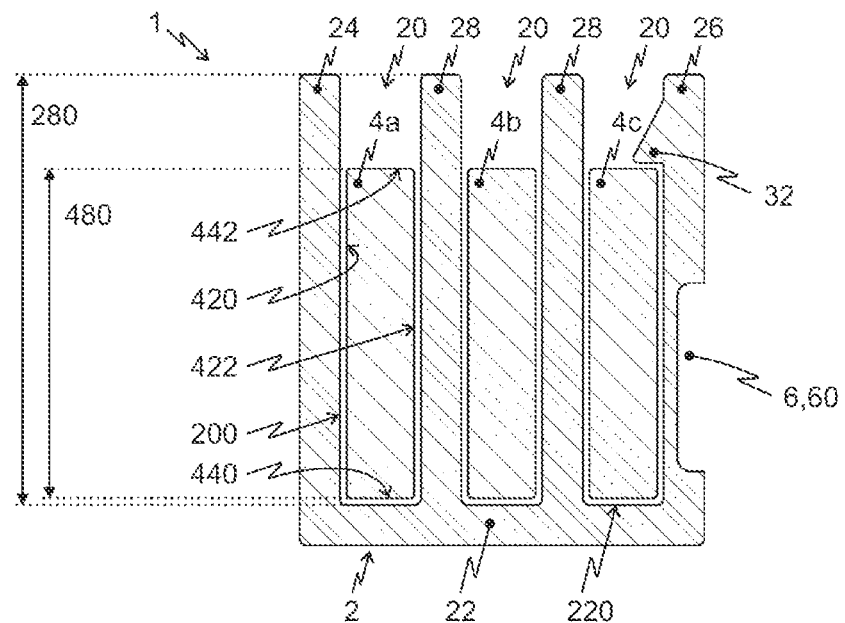
FIG. 1 shows a cross section through a first module according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows a first module 1 according to the invention in cross section. A moulded plastic body 2 is represented, in particular formed from a silicone rubber, more precisely a crosslinked liquid silicone rubber—LSR having a Shore A hardness of between 55 and 60. In this configuration, the moulded plastic body 2 forms three channels 20 by a first and a second edge body 24, 26 in each case laterally protruding perpendicularly from a bottom body part 220 and two partition bodies 28 protruding between these edge bodies 24, 26, likewise perpendicularly and with the same height 280. The height 280 is measured from the inner side 200 of the channel 20 of the bottom body 220 to the end of the edge body 24, 26 or partition body 28. Furthermore, purely by way of example and without restriction of generality, the second edge body 26 comprises a stop means formed as a lip 32. This lip 32 in this case projects into the interior of the channel 20.

Arranged in each channel 20 there is a load terminal element 4, which is technically conventional in respect of its material and is configured as a flat shaped metal body having a first main face and a second main face opposite the latter, 420, 422. The shaped metal body furthermore has a first secondary face and a second secondary face opposite the latter, 440, 442, these secondary faces respectively connecting the main faces. The load terminal element 4 therefore has a rectangular cross section.

Each load terminal element 4 is arranged in an associated channel 20, and not materially bonded there. In this case, the main faces 420, 422 are respectively turned towards an edge body 24, 26 or partition body 28, while the first secondary face 440 is turned towards the bottom body part 220. The respective load terminal element 4 is therefore turned towards the inner side 200 of the channel 20 with three sides. The lip 32 of the second edge body 26 ensures form-fit fixing of the load terminal element 4 arranged in the associated channel 20. Alternatively, or else in addition, the load terminal elements 4 may be fixed in the respectively associated channel 20 with a force-fit, by the channel 20 being configured during the production of the moulded plastic body 2 to be slightly narrower in comparison with the extent of the load terminal element 4 from the first to the second main face, 420, 422.

In this first configuration of the module 1 according to the invention, all load terminal elements 4 have the same width 480, that is to say extent between the secondary faces 440, 442. Likewise, according to the invention, the height 280 of each partition body 28 is in each case greater than the width 480 of the two neighbouring load terminal elements 4.

In order to cool the right terminal element 4c, the neighbouring second edge body 26 has an indentation 6, 60 directed towards a main face 422 of the directly neighbouring terminal element 4c, which is turned towards the second edge body 26. This indentation 60 is configured as an indentation 62 that does not extend entirely through. However, the remaining wall thickness is selected to be that minimal in order to ensure sufficient electrical insulation from a neighbouring body (not represented).

The main face 420, 422, turned towards this indentation 60, of the load terminal element 4c arranged directly adjacent bears flush on the inner side of the associated channel 20. By a thermally conductive substance (not represented) arranged outside the moulded plastic body 2, the terminal element 4c, in particular the section thereof that experiences its greatest heating there during operation, can therefore be cooled very effectively without having to take the electrical insulation into account.

The same configuration of the module 1 may also be used to cool an indirectly neighbouring terminal element 4b that experiences its greatest heating there during operation. The directly neighbouring terminal element 4c is in this case used as an additional thermal conductor, through which the heat is dissipated from the indirectly neighbouring terminal element 4b.

Figure 2:
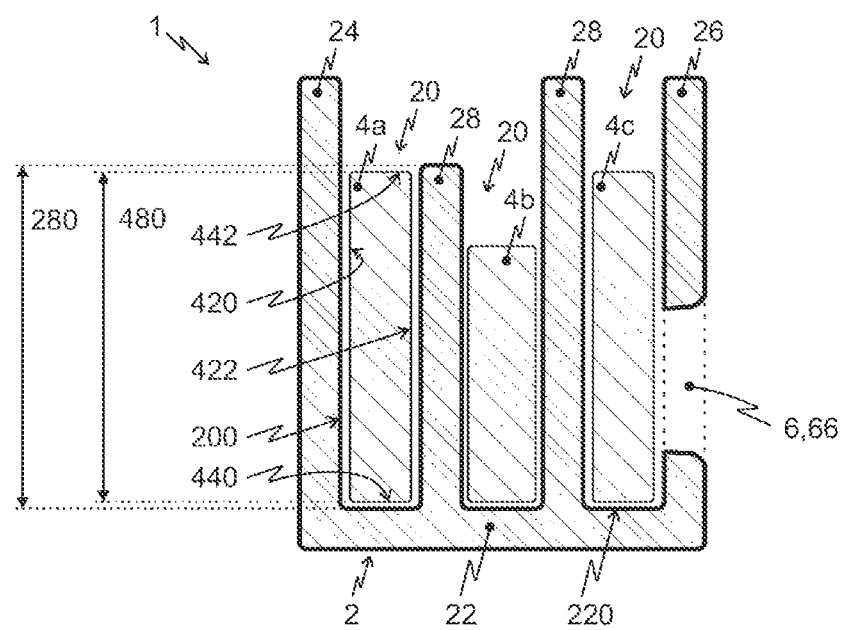
FIG. 2 shows a cross section through a second module according to the invention.
Figure 3:
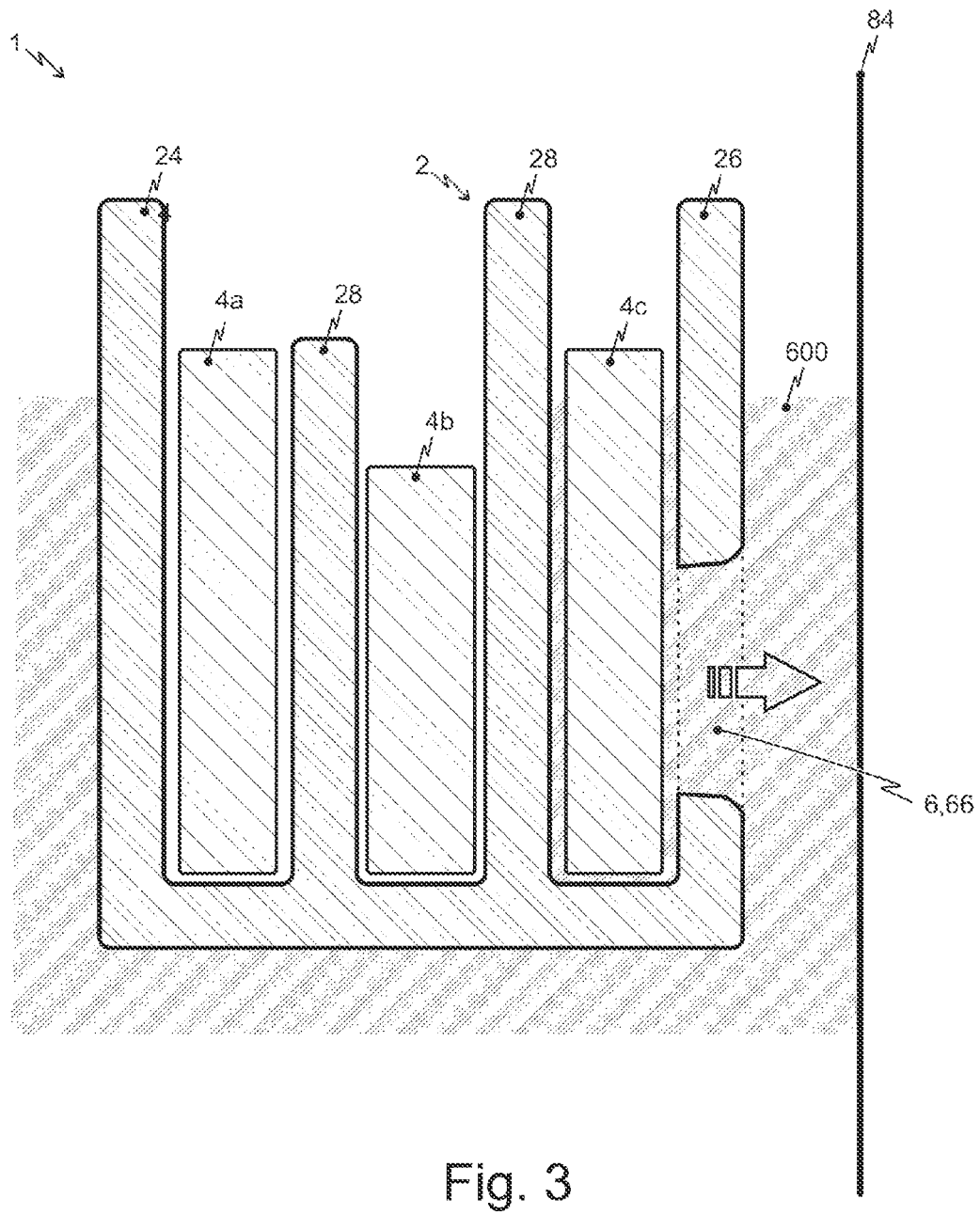
FIG. 3 shows the functionality of the second module.

FIG. 2 shows a cross section through a second module according to the invention. FIG. 3 shows the functionality of the second module. The basic configuration of the moulded plastic body 2 and of the load terminal elements 4 is identical to that according to FIG. 1. In contrast thereto, the central load terminal element 4b has a smaller width 480 but greater thickness. According to the invention, the height 280 of the left partition body 28 is greater than the width 480 of that neighbouring load terminal element 4b, here the central one, which has the smaller width. Furthermore, the height 280 of the left partition body 28 is greater even than the width 480 of that neighbouring load terminal element 4a, here the left one, which has the greater width 480. This configuration is preferred over the minimum requirement.

In order to cool the right terminal element 4c, the neighbouring edge body 26 has an indentation 6, 66 directed towards a main face 422 of the directly neighbouring terminal element 4c, which is turned towards the edge body 26. This indentation 66 is configured as an indentation that extends entirely through, so that the moulded plastic body 2 no longer has any electrically insulating effect here.

The main face 420, 422, turned towards this indentation 66, of the load terminal element 4c arranged directly adjacent is arranged spaced apart from the inner side of the associated channel 20. As represented in FIG. 3, a thermally conductive substance 600 may therefore penetrate through this indentation 66 into the channel 20 without necessarily flooding the latter entirely, either in respect of its height or in respect of its length.

The thermally conductive substance 600 is configured here as an electrically insulating casting compound filled with thermally conductive ceramic particles. By this thermally conductive substance 600, the terminal element 4c, in particular the section of the latter which experiences its greatest heating there during operation, is cooled very effectively by heat being transferred to a cooling surface 84. Here, without restriction of generality, this cooling surface 84 is a part of a liquid cooling device of a power semiconductor device 8.

This configuration of the module 1 may also be used to dissipate heat from an indirectly neighbouring terminal element 4b.

FIG. 4 shows a moulded plastic body 2 of a third module 1 according to the invention, while FIGS. 5 and 6 show this third module 1 according to the invention in two views, FIG. 6 in a sectional view. The moulded plastic body 2 in this case comprises three channels 20, which have a different length but the same height. In particular the central channel 20 has a right-angled bend in its profile. In principle, the profile of the channels 20 may be configured very flexibly owing to the configuration as a moulded plastic body 2 made of silicone rubber.

Furthermore, represented is an indentation 64 of a first edge body 24, which extends entirely through. As is represented in FIG. 5, the second edge body 26 likewise has a corresponding indentation 66 that extends entirely through. In principle, the functionalities of the respective indentation 6, 64, 66 have already been outlined above. FIG. 6 shows both indentations 64, 66 in a section through the module.

FIG. 5 moreover shows three load terminal elements 4 arranged in associated channels 20 of the moulded plastic body 2. These load terminal elements 4 are configured as described above as flat shaped metal bodies having two main faces and two secondary faces, and in this case, each have a terminal section 46 configured as a screw socket. In each case, one second tab 50 per load terminal element 4 is used as a further terminal section.

The respective load terminal element 4 is arranged over a substantial portion, here in each case more than 80%, of its length in an associated channel 20 of the moulded plastic body 2. All three load terminal elements 4 furthermore have a right-angled corner 48, which is arranged in the bend of the associated channel 20.

Figure 7:
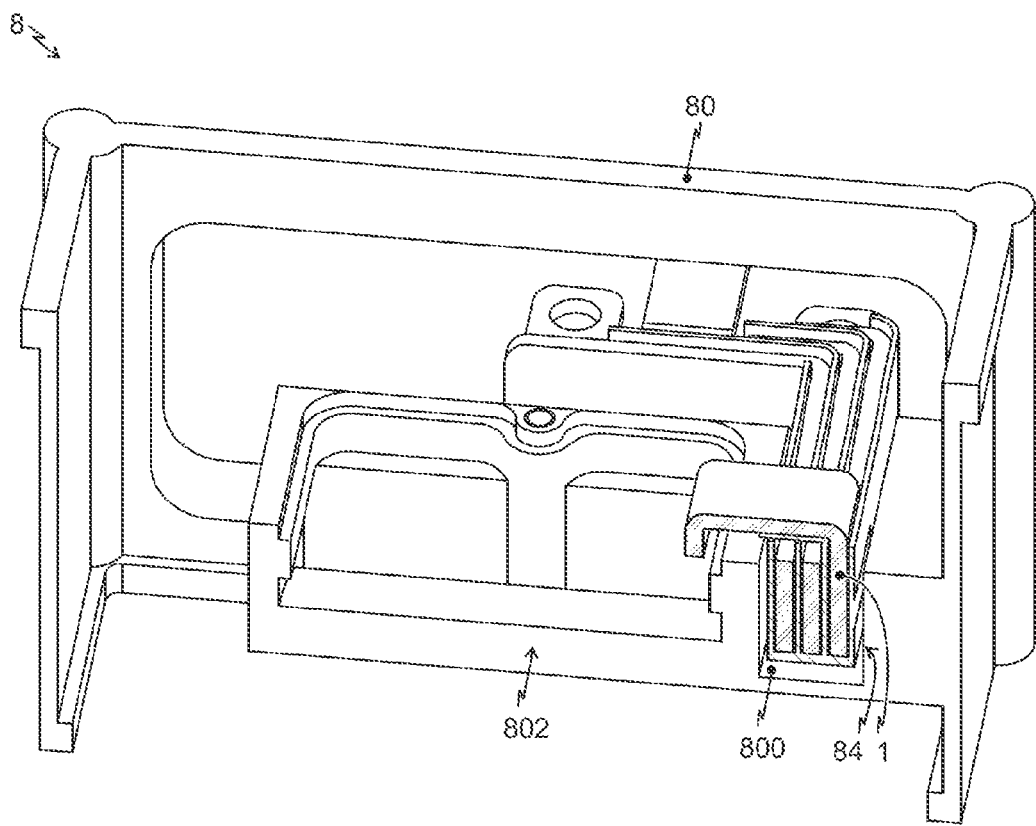
FIG. 7 shows a power semiconductor device according to the invention having the third module according to the invention.

FIG. 7 shows a power semiconductor device 8 according to the invention having the third module 1 according to the invention in a three-dimensional sectional representation. A liquid cooling device 80 of the power semiconductor device 8, having two recesses 800, 802, is represented. The aforementioned module 1 is arranged in one recess 800, while (although not shown here) a power electronic three-level switching device is arranged in a further recess 802. The cooling surfaces 84 are the side walls of the recess 800 of the module 1.

Representation of the AC voltage terminals and further components has been omitted here for the sake of clarity.

Figure 8:
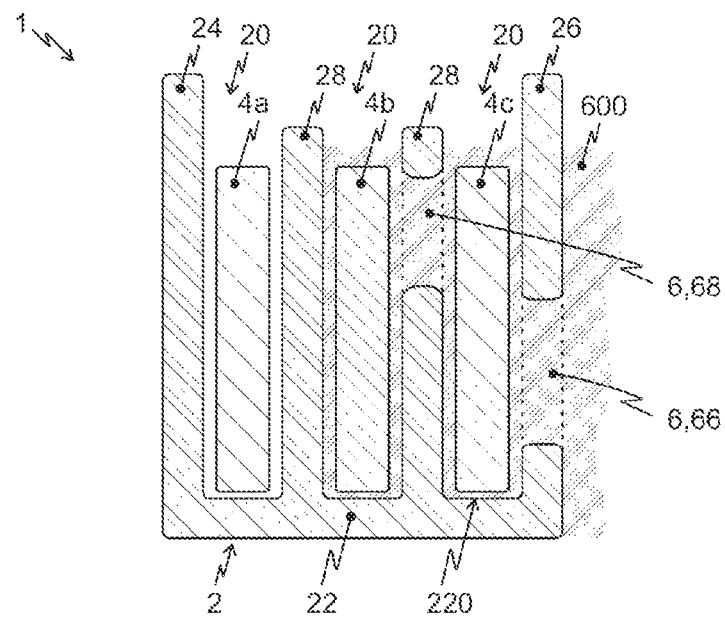
FIG. 8 shows a cross section through a fourth module according to the invention.

FIG. 8 shows a cross section through a fourth module 1 according to the invention, which differs from that according to FIGS. 2 and 3 by an additional indentation 6, 68, which is arranged in a partition body 28 and is configured as an indentation 6, 68 that extends entirely through. Not only can that channel therefore be filled with a thermally conductive substance 600, but the neighbouring channel 20 may also be filled through this additional indentation 68. The dissipation of heat from the load terminal elements 4b, 4c may therefore be improved further. This relates in particular to those in direct contact with the thermally conductive substance 600.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure covers modifications and variations of this disclosure provided they come within the scope of the appended claims and their equivalents.

What is claimed is:

1. A power semiconductor device, comprising:
    a module, comprising:
        a moulded plastic body and a plurality of load terminal elements of a power semiconductor device;
        the plurality of load terminal elements are respectively configured as flat shaped metal bodies having a first main face and a second main face opposite the first main face, and having a first secondary face and a second secondary face opposite the first secondary face;
        the respective first secondary faces and second secondary faces connect the respective main faces, and respective terminal sections;
        the moulded plastic body, further comprising:
            a plurality of channels and a bottom body part, a first and a second edge body and a partition body;
            wherein said plurality of load terminal elements is in each case arranged respectively at least with a substantial section in an associated channel and wherein at last one of said respective first edge body and said second edge body of one of said channels has an indentation directed towards at least one of said first main face and said second main face of a directly neighboring terminal element;
    a power electronic switching device, wherein the module is arranged in a recess of a housing or of a cooling device of the power semiconductor device; and
    wherein the module is thermally conductively connected to a cooling surface by means of a thermally conductive substance, particularly in the region of the indentation.

2. The power semiconductor device, according to claim 1, wherein:
    the indentation is configured as an indentation that extends entirely through.

3. The power semiconductor device, according to claim 2, wherein:
    the indentation is arranged in a section of the channel that is arranged next to a subsection of a section of the directly neighboring terminal element which experiences its greatest heating there during operation.

4. The power semiconductor device, according to claim 2, wherein:
    the indentation (6) is arranged in a section of the channel (22) that is arranged next to a subsection of the section of the indirectly neighboring terminal element (4a, 4c) which experiences its greatest heating there during operation.

5. The power semiconductor device, according to claim 2, wherein:
    the main face of the load terminal element arranged directly next to the indentation and that is turned towards the indentation is arranged spaced apart from an inner side of the associated channel.

6. The power semiconductor device, according to claim 2, wherein:
    the partition body has an indentation that extends entirely through.

7. The power semiconductor device, according to claim 2, wherein:
    the partition body has an indentation that does not extend entirely through.

8. The power semiconductor device, according to claim 2, wherein:
    the moulded plastic body is formed from a material selected from the group consisting of an elastomer, a silicone rubber, a thermally stabilized silicone rubber, a polyolefin, a modified PTFE, a filled PTFE, and a silicate-filled PTFE; and.
    wherein the material has a Shore A hardness of between 30 and 90.

9. The power semiconductor device, according to claim 2, wherein:
    a height of the partition body is in each case at least as great as a width of the neighboring load terminal element which has a greater width.

10. The power semiconductor device, according to claim 2, wherein:
    one of the edge bodies or one of the partition bodies further comprises:
        a stop means, which is configured to limit a movement of the load terminal element arranged in an associated channel out of the channel, and away from the bottom body.

11. The power semiconductor device, according to claim 1, wherein:
    the main face of the load terminal element arranged directly next to the indentation and that is turned towards the indentation directly abuts an inner side of the associated channel.

12. The power semiconductor device, according to claim 1, wherein:
    one of the plurality of load terminal elements has a corner, preferably arranged in the channel.

13. The power semiconductor device, according to claim 1, wherein:
    the housing or the cooling device further comprises the cooling surface.

14. The power semiconductor device, according to claim 1, wherein:
    the cooling device is configured as an air or liquid cooling device.

15. The power semiconductor device, according to claim 1, wherein:
    the thermally conductive substance is at least one of an electrically insulating casting compound, an electrically insulating casting compound containing thermally conductive particles, and an electrically insulating casting compound containing ceramic particles.

* * * * *